US011015262B2

(12) United States Patent
Najafi-Yazdi et al.

(10) Patent No.: US 11,015,262 B2
(45) Date of Patent: May 25, 2021

(54) APPARATUS AND METHOD FOR MOLECULAR BEAM EPITAXY

(71) Applicant: ANYON SYSTEMS INC., Dorval (CA)

(72) Inventors: Alireza Najafi-Yazdi, Vaudreuil-Dorion (CA); William Georges, La Prairie (CA)

(73) Assignee: ANYON SYSTEMS INC., Dorval (CA)

(*) Notice: Subject to any disclaimer, the term of this patent is extended or adjusted under 35 U.S.C. 154(b) by 0 days.

(21) Appl. No.: 16/634,717

(22) PCT Filed: Feb. 21, 2019

(86) PCT No.: PCT/CA2019/050212
§ 371 (c)(1),
(2) Date: Jan. 28, 2020

(87) PCT Pub. No.: WO2019/161498
PCT Pub. Date: Aug. 29, 2019

(65) Prior Publication Data
US 2020/0399782 A1    Dec. 24, 2020

Related U.S. Application Data

(60) Provisional application No. 62/633,549, filed on Feb. 21, 2018.

(51) Int. Cl.
*C30B 23/02* (2006.01)
*C23C 14/28* (2006.01)
*C23C 14/50* (2006.01)

(52) U.S. Cl.
CPC .............. *C30B 23/02* (2013.01); *C23C 14/28* (2013.01); *C23C 14/505* (2013.01)

(58) Field of Classification Search
CPC ..... C30B 23/02; F04B 37/08; H01L 21/02631
See application file for complete search history.

(56) References Cited

U.S. PATENT DOCUMENTS 3,915,765 A * 10/1975 Cho .................. H01L 21/02395
438/379
4,239,955 A * 12/1980 Cho ....................... C30B 23/063
219/424

(Continued)

FOREIGN PATENT DOCUMENTS

JP         2004035325         7/2002

OTHER PUBLICATIONS

International Search Report and Written Opinion dated May 2, 2019 in connection with International Patent Application No. PCT/CA2019/050212.

(Continued)

*Primary Examiner* — Jaehwan Oh
(74) *Attorney, Agent, or Firm* — Norton Rose Fulbright Canada LLP

(57) ABSTRACT

An apparatus and method for molecular beam epitaxy are described herein. The apparatus comprises an enclosure defining a vacuum chamber. A substrate holder is mounted within the vacuum chamber. At least one molecular beam source is in fluid communication with the vacuum chamber. A cooling shroud having at least one surface is mounted within the vacuum chamber spaced from the substrate holder. A cryocooler having at least a portion extending into the vacuum chamber is operatively coupled to the cooling shroud for extracting heat therefrom, and cooling the at least one surface of the cooling shroud to cryogenic temperatures.

20 Claims, 4 Drawing Sheets

(56) References Cited

U.S. PATENT DOCUMENTS

| | | | | |
|---|---|---|---|---|
| 5,041,719 | A * | 8/1991 | Harris | C30B 29/48 |
| | | | | 219/390 |
| 6,139,643 | A * | 10/2000 | Yamamoto | C30B 23/066 |
| | | | | 118/715 |
| 6,367,267 | B1 * | 4/2002 | Colombo | C30B 23/02 |
| | | | | 62/50.5 |
| 6,718,775 | B2 | 4/2004 | Colombo et al. | |
| 8,192,547 | B2 | 6/2012 | Gotthold et al. | |
| 2003/0146433 | A1 * | 8/2003 | Cantwell | H01L 21/02579 |
| | | | | 257/43 |
| 2006/0236936 | A1 * | 10/2006 | Pfeiffer | A61B 18/1492 |
| | | | | 118/726 |
| 2008/0134975 | A1 * | 6/2008 | Gotthold | F04B 37/08 |
| | | | | 118/723 VE |
| 2010/0050661 | A1 * | 3/2010 | Snow | F25B 9/14 |
| | | | | 62/51.1 |

OTHER PUBLICATIONS

International Preliminary Report on Patentability dated Oct. 8, 2019 in connection with International Patent Application No. PCT/CA2019/050212.

* cited by examiner

APPARATUS AND METHOD FOR MOLECULAR BEAM EPITAXY

TECHNICAL FIELD

The present disclosure relates generally to molecular beam epitaxy, and more particularly to cooling surfaces inside a vacuum chamber to cryogenic temperatures.

BACKGROUND OF THE ART

Molecular beam epitaxy, hereafter referred to as MBE, is a technique for growing thin films of single crystals on substrates. The technique is widely used for producing high purity semiconductors, superconductors, nano-electronic, and quantum-electronic components. In MBE, one or more sources containing the material to be grown are placed in a vacuum chamber and the sources are heated to create a beam of evaporated material in the direction of the substrate.

To prevent impurities from contaminating the growing film, the background gas pressure in an MBE vacuum chamber is typically on the order of $1\times10^{-11}$ to $1\times10^{-10}$ mbar. To achieve and maintain such low pressure levels, cryogenic panels are generally placed inside the vacuum chamber. Such panels are commonly referred to as cooling shrouds. At cryogenic temperatures, impurities condense and are trapped on the surface of the cooling shroud, reducing the pressure in the chamber. This effect is known as cryo-pumping. The cooling shrouds are typically cooled by cryogenic fluids, such as liquid nitrogen to a temperature of about 77 K. In some instances liquid helium is used to cool the shrouds to 4 K.

When cooling with cryogenic fluids, the shrouds and vacuum chamber require careful design of flow channels to prevent cryogen leaks into the vacuum. Expensive cryogenic piping and storage tanks must also be added to the system. Furthermore, unless a costly recuperation system is put in place, cryogens will boil off over time, which mandates periodic refills of cryogenic storage tanks. Moreover, the handling of cryogenic fluids presents a safety hazard in the form of frostbite and asphyxiation.

Therefore, improvements are needed.

SUMMARY

In accordance with a broad aspect, there is provided an apparatus for molecular beam epitaxy. The apparatus comprises an enclosure defining a vacuum chamber. A substrate is mounted within the vacuum chamber. At least one molecular beam source is in fluid communication with the vacuum chamber. A cooling shroud having at least one surface is mounted within the vacuum chamber spaced from the substrate. A cryocooler having at least a portion extending into the vacuum chamber is operatively coupled to the cooling shroud for extracting heat therefrom, and cooling the at least one surface of the cooling shroud to cryogenic temperatures.

In some embodiments, the cryocooler comprises a base outside of the enclosure, a cooling tube mounted to the base and extending into the vacuum chamber and a cold finger mounted to the cooling tube inside the vacuum chamber.

In some embodiments, the apparatus further comprises a vibration damping mechanism attaching the cryocooler to the enclosure. The vibration damping mechanism may be provided inside or outside of the enclosure.

In some embodiments, the cryocooler comprises a plurality of stages, and each one of the stages is operatively coupled to the cooling shroud.

In some embodiments, the apparatus further comprises a thermal coupling mechanism between the cryocooler and the cooling shroud.

In some embodiments, the cooling shroud comprises a plurality of spaced apart sections. The plurality of sections of the cooling shroud may be nested or provided in another arrangement.

In some embodiments, the substrate is mounted within the vacuum chamber by a multi-axis deposition stage that can rotate, tilt, and/or move in x, y, z.

In some embodiments, the cryocooler is a Gifford-McMahon cryocooler or a pulse tube cryocooler.

In accordance with another broad aspect, there is provided a method for molecular beam epitaxy. A molecular beam of materials is generated towards a substrate mounted inside a vacuum chamber to grow a film on the substrate. A cooling shroud inside the vacuum chamber is cooled to a cryogenic temperature using a cryocooler operatively coupled to the cooling shroud, the cooling shroud having at least one surface spaced from the substrate. Impurities inside the vacuum chamber are trapped on the at least one surface of the cooling shroud.

In some embodiments, the method further comprises displacing the substrate while growing the film on the substrate. Displacing the substrate may comprise rotating and/or tilting the substrate.

In some embodiments, the method further comprises changing an angle between the substrate and the molecular beam while growing the film on the substrate.

In some embodiments, the method further comprises damping vibration caused by the cryocooler through a vibration damping mechanism attaching the cryocooler to an enclosure defining the vacuum chamber.

In some embodiments, trapping impurities on the at least one surface of the cooling shroud comprises trapping impurities on a plurality of spaced apart sections of the cooling shroud. The plurality of sections may be nested or provided in another arrangement.

In some embodiments, cooling the cooling shroud comprises applying the cryocooler to the plurality of sections using multiple stages of the cryocooler.

In some embodiments, cooling the cooling shroud comprises applying an end of the cryocooler to a thermal coupling mechanism in contact with the cooling shroud.

In some embodiments, the cryocooler is a Gifford-McMahon cryocooler or a pulse tube cryocooler.

Features of the systems, devices, and methods described herein may be used in various combinations, in accordance with the embodiments described herein.

BRIEF DESCRIPTION OF THE DRAWINGS

Reference is now made to the accompanying figures in which.

DETAILED DESCRIPTION

Figure 1:
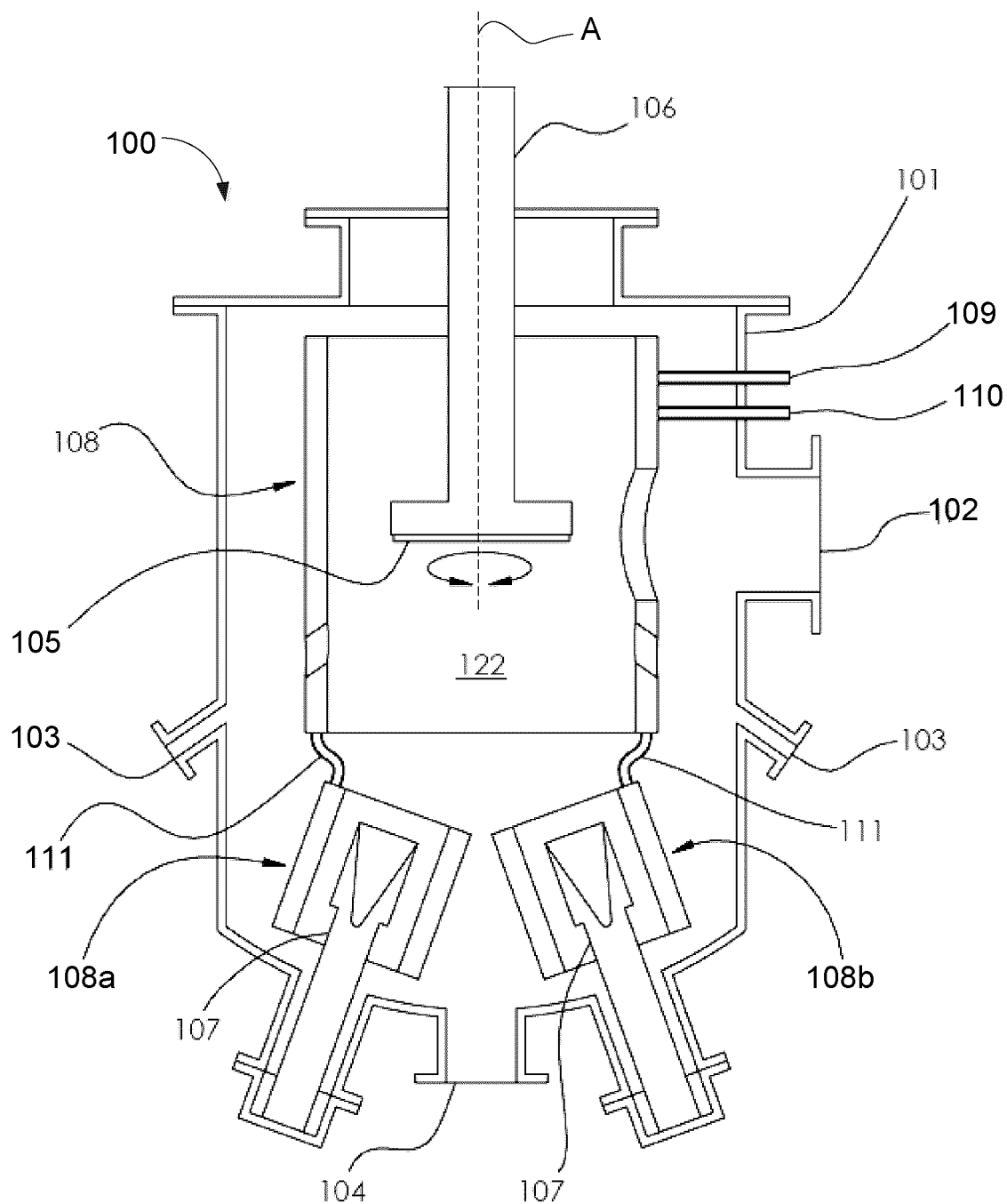
FIG. 1 is a cross-sectional view of an example apparatus for molecular-beam epitaxy as per the prior art.

A molecular-beam epitaxy (MBE) apparatus 100 that makes use of cryogenic fluids as per the prior art is shown in FIG. 1. The outside of the apparatus 100 consists of an enclosure 101 defining a vacuum chamber 122. The enclosure 101 has a plurality of ports, such as ports 102, 103, 104, for substrate entry, instrumentation, and evacuation, respectively, with suitable vacuum pumps (not shown). A substrate 105 onto which films are to be grown is placed on a deposition stage 106, rotatable about axis A. The film is deposited using material sources 107 such as effusion cells or e-beam evaporators. One or more cooling shrouds 108, to be cooled by the cryogenic fluids, are placed at various locations in the chamber 100 for cryo-pumping residual gas. These shrouds 108 must be fed the cryogenic fluids by a complex piping system (not shown) through inlet and outlet tubes 109 and 110. If multiple shrouds 108, 108a, 108b are used, then additional cryogenic tubing 111 inside the vacuum space may be provided to allow the cryogenic fluids to flow from one cooling shroud 108 to other cooling shrouds 108a, 108b.

Figure 2:
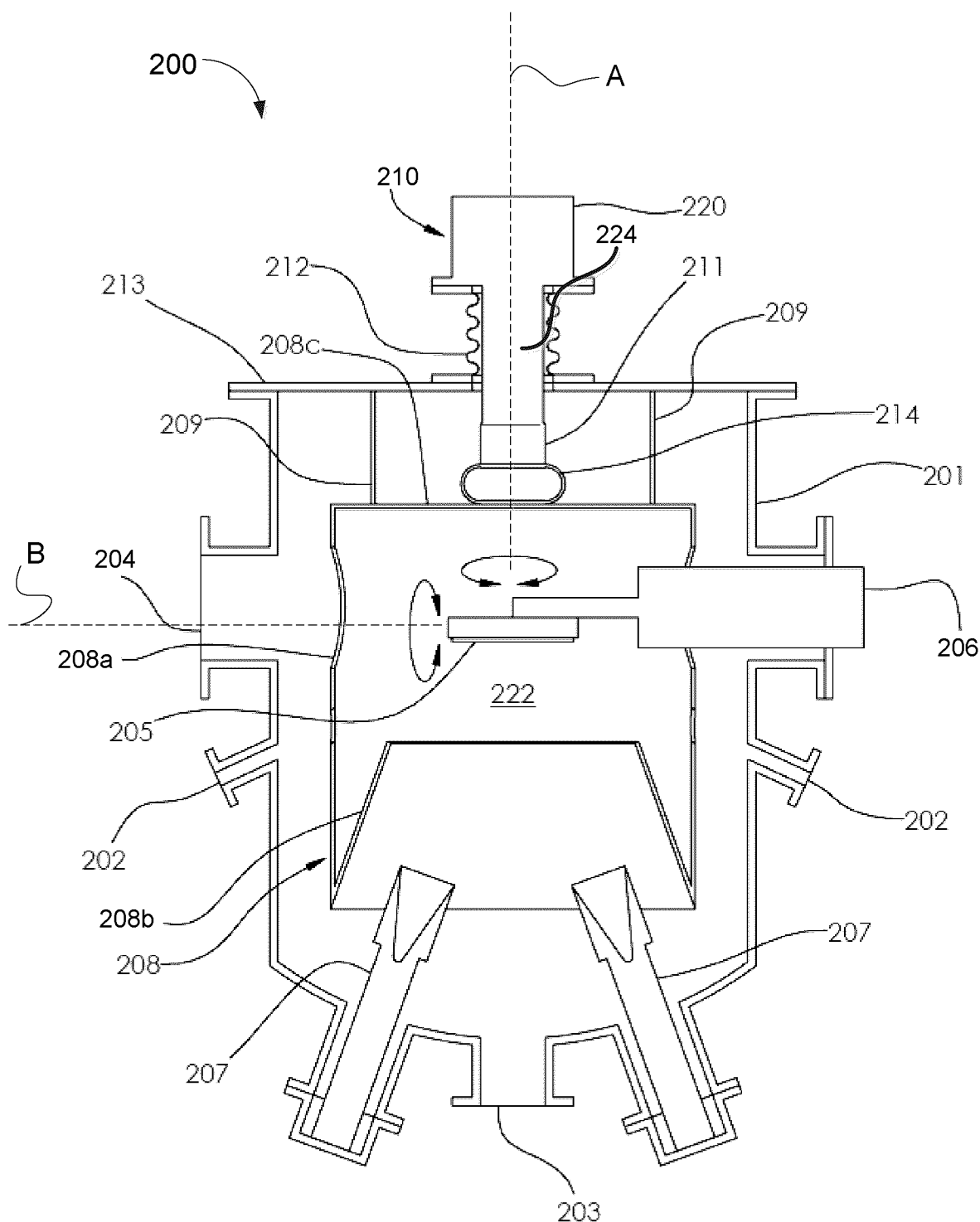
FIG. 2 is a cross-sectional view of an example apparatus for molecular-beam epitaxy having a single stage cryocooler, in accordance with some embodiments.

FIG. 2 illustrates an apparatus 200 for MBE. An enclosure 201 defines a vacuum chamber 222, such as an ultra-high vacuum chamber. The chamber 222 may be in fluid communication with one or more ports formed on the enclosure 201. In the embodiment illustrated, ultra-high vacuum tight access ports 202, 203, 204 are provided for measurement systems (e.g. a reflection high energy electron diffraction (RHEED) system), evacuation, and substrate entry and removal, respectively. A substrate 205 is placed within the vacuum chamber 222 on a substrate holder 206, for example a deposition stage. The substrate holder 206 may rotate the substrate 205 about different axes, such as axis A and/or axis B, allowing for capabilities such as glancing angle deposition. In some embodiments, the substrate holder 206 may also tilt the substrate and/or displace the substrate linearly in x, y, and z. In some embodiments, the substrate holder 206 is fixedly mounted inside the chamber 222.

At least one molecular beam source 207, for example an effusion cell or electron beam evaporator, is placed in fluid communication with the vacuum chamber 222. In the example illustrated, two sources 207 are provided some distance bellow the substrate 205 inside the chamber 222. The sources 207 are positioned so as to generate molecular beams of material towards the substrate 205 in order to grow a film on the substrate 205. While illustrated as coming from below the substrate 205, molecular beam sources 207 may be positioned elsewhere within the chamber 222 to direct the molecular beams towards the substrate from the sides, top, or any other direction.

A cooling shroud 208 is mounted within the vacuum chamber 222. The cooling shroud 208 has at least one surface 208a spaced from the substrate 205 and made of a high thermal conductivity material. Examples of materials for the cooling shroud 208 are polymer materials, oxide materials, nitrides materials, carbon family materials, metal materials, iron-based materials, high thermal conductivity graphite and the like. The surface 208a may be shaped as desired, such as but not limited to a cylinder, a square, a rectangle, and the like. In some embodiments, the surface 208a forms an irregular shape. The shape formed by the surface 208a can be open or closed. In some embodiments, additional surfaces, such as surface 208b and/or 208c are also provided. Surfaces 208b and/or 208c may form an integral piece with surface 208a or they may be separate therefrom while remaining in contact therewith. In the example illustrated, surface 208a surrounds the substrate 205, surface 208b is underneath the substrate 205, and surface 208c is above the substrate 205. It will be understood that surface 208a may be positioned differently than what is illustrated, such as above or below the substrate 205. Although illustrated with straight lines, the cooling shroud 208 may be corrugated, bent, and/or coated with adsorbent material to increase the surface area and gas pumping capacity.

In some embodiments, the cooling shroud 208 is attached to the enclosure 201 by one or more support, such as supports 209. Various materials may be used for supports 209. In some embodiments, the supports 209 are formed of thermally insulated material with low outgassing characteristics to minimize the heat leak from the enclosure 201 to the cooling shroud 208. Examples of thermally insulated materials for the supports 209 are stainless steel, graphite, ceramics, and the like.

A cryocooler 210 having at least a portion extending into the vacuum chamber 222 of the apparatus 200 is operatively coupled to the cooling shroud 208. In some embodiments, coupling between the cryocooler 210 and the cooling shroud 208 occurs via a thermal coupling mechanism 214. The thermal coupling mechanism 214 may be made of any thermally conductive material with low outgassing characteristics, allowing heat transfer between the cooling shroud 208 and the cryocooler 210, such as metals, carbon family materials, high thermal conductivity graphite and the like. The thermal coupling mechanism 214 may take various forms, such as but not limited to a plate, a strap, a ring, a block, and the like. In some embodiments, the thermal coupling mechanism is flexible and/or resilient, so as to damp vibrations transmitted by the cryocooler 210 to the cooling shroud 208. Alternatively, the cryocooler 210 may be placed in direct contact with the cooling shroud 208 and the thermal coupling mechanism 214 may be omitted.

In some embodiments, the cryocooler 210 comprises a base 220 and a cooling tube 224 mounted to the base. The cooling tube 224 extends through an opening in the enclosure, such as a port. A cold finger 211 is mounted to the cooling tube 224 and is coupled to the cooling shroud 208, directly or indirectly.

In some embodiments, the cryocooler 210 is attached to the enclosure 201 by a vibration damping mechanism 212, such as a flexible metal bellow. The vibration damping mechanism 212 may be outside of the enclosure 201 or inside the enclosure. In some embodiments, the vibration damping mechanism 212 is inserted into a port or other opening of the enclosure 201, and may have a portion inside the enclosure 201 and a portion outside of the enclosure 201. Alternatively, the vibration damping mechanism 212 may be omitted and the cryocooler 208 may be inserted directly into a port of the enclosure 201, or simply inserted into an aperture of the enclosure 201 and attached to a surface thereof, such as top surface 213.

Although only one cryocooler 210 is illustrated, two or more cryocoolers 210 may be provided in the apparatus 200. Any cryocooler 210 known in the art, such as a Gifford-McMahon cryocooler or a Pulse Tube cryocooler, may be used to cool the cooling shroud 208 to cryogenic temperatures. Cryogenic temperatures are defined as temperatures at or below −180° C. (93 K; −292° F.).

The cryocooler 210 of apparatus 200 is referred to as a single stage cryocooler, as it comprises a single point of contact (direct or indirect) with the cooling shroud 208, for example the cold finger 211. Single stage cryocoolers can reach temperatures such as 80 K to 30 K, depending on the design of the chamber and the cooling power of the cryocooler. In some embodiments, the cryocooler has a plurality of stages, i.e. multiple points of contact with a cooling shroud. Multistage cryocoolers may have more than one cold finger and can reach temperatures below 30 K, to obtain lower pressures in the chamber.

Figure 3:
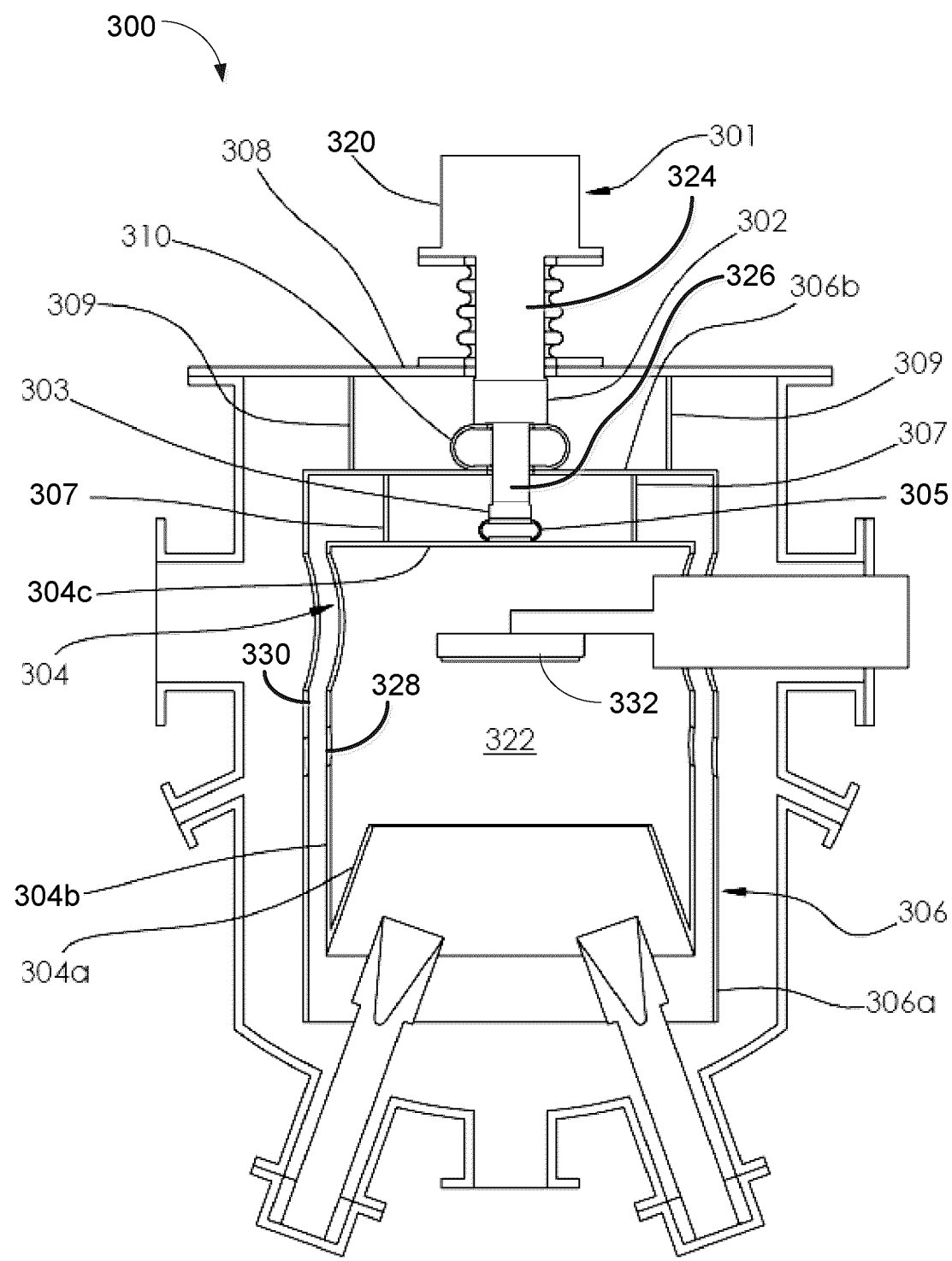
FIG. 3 is a cross-sectional view of an example apparatus for molecular-beam epitaxy having a double stage cryocooler, in accordance with some embodiments.

An example embodiment of a multiple-stage cryocooler 301 is illustrated in FIG. 3, as part of MBE apparatus 300. In this example, the cryocooler 301 comprises a base 320 having a first cooling tube 324 mounted thereto. A first cold finger 302 is mounted to the first cooling tube 324. A second cooling tube 326 extends below the first cold finger 302 and has mounted thereto a second cold finger 303. Each one of the first cold finger 302 and the second cold finger 303 is operatively coupled to the cooling shroud 304 via a thermal coupling mechanism 310, 305, respectively, which may also be omitted in other embodiments. In some embodiments, the first and second cold fingers 302, 303 are provided at different temperatures, for example the first cold finger 302 being at a higher temperature than the second cold finger 303. Alternatively, the first and second cold fingers 302, 303 are at a same temperature.

In some embodiments, the different stages of the cryocooler 301 are coupled, directly or indirectly, to different surfaces of the cooling shroud 304. Alternatively, or in combination therewith, the cooling shroud 304 may be composed of two or more spaced apart sections, such as sections 328, 330. The sections 328, 330 may be nested, as illustrated, or may be arranged in another configuration, such as one above the substrate 332 and one below the substrate 332. Other configurations are also considered. Each section 328, 330 has at least one surface, such as surfaces 304a, 304b, 304c for section 328. Section 330 may have the same number and/or arrangement of surfaces as section 328 or be different therefrom.

Each section 328, 330 of the cooling shroud 304 may be formed independently from one another and separately attached to the enclosure 308 inside the vacuum chamber 322. Alternatively, the sections 328, 330 are attached together, for example using supports 307, and the attached sections 328, 330 are themselves attached to the enclosure 308, for example using supports 309. Other arrangements for mounting the multi-section cooling shroud 304 inside the chamber 322 are also considered.

In the embodiment illustrated, the first cold finger 302 is coupled to section 330 of the cooling shroud 304 while the second cold finger 303 is coupled to the section 303 of the cooling shroud 304. It will be understood that more than two sections 328, 330 of the cooling shroud 304 may be provided, with each section having a direct or indirect coupling to a stage of the cryocooler 301. In some embodiments, a thermal coupling mechanism 310, 305 is used at each stage of the cryocooler 301 to reduce vibrations generated by the cryocooler 301.

As stated above, two or more cryocoolers 301 may be provided for a same apparatus 300. In some embodiments, a separate cryocooler 301 is provided for each section 328, 330 of the cooling shroud 304. Other arrangements are also considered.

Figure 4:
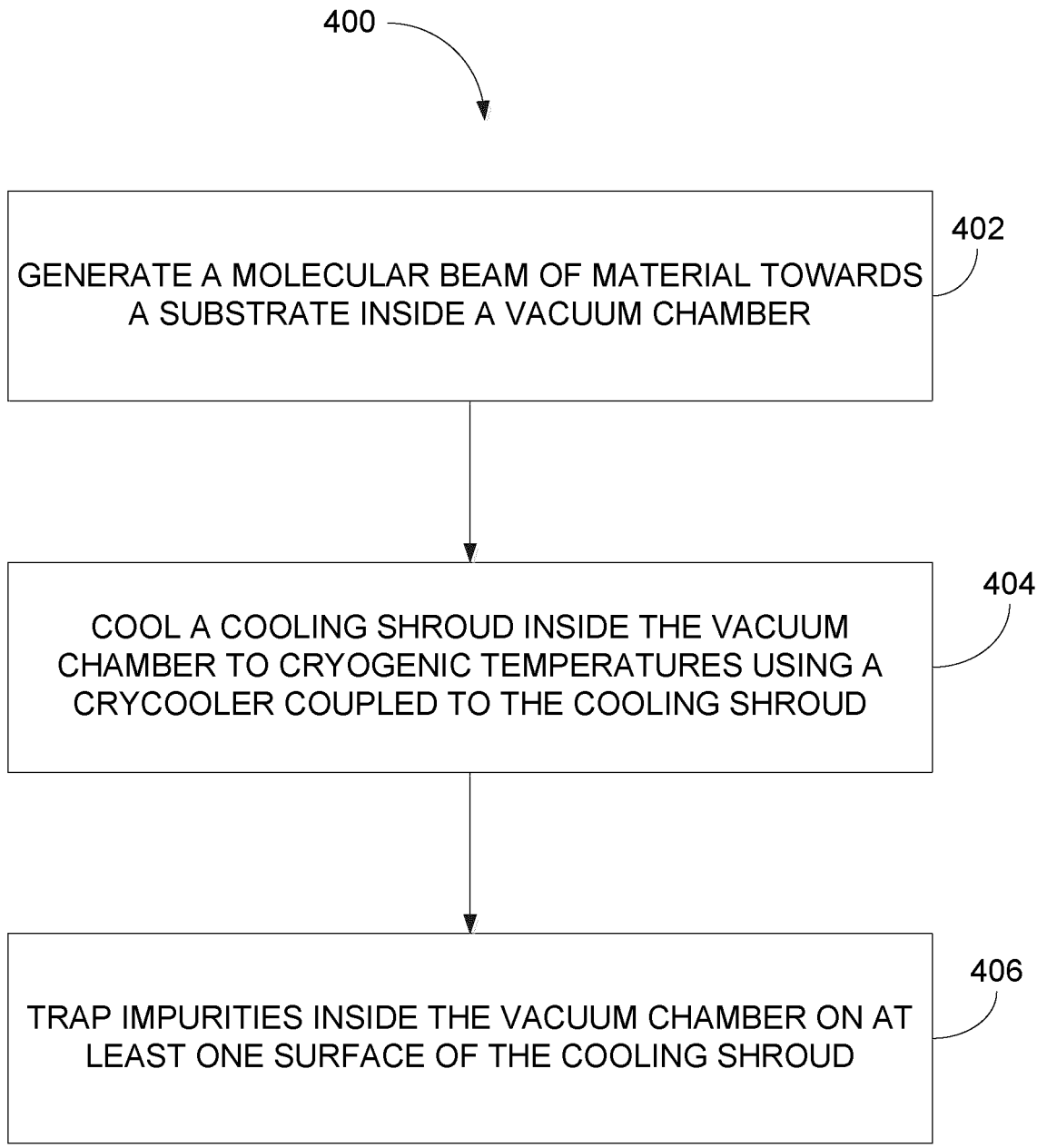
FIG. 4 is a flowchart of an example method for molecular beam epitaxy, in accordance with some embodiments.

FIG. 4 illustrates an example method 400 for molecular beam epitaxy. At step 402, a molecular beam of material is generated towards a substrate mounted inside a vacuum chamber, in order to grow a film on the substrate. For example, sources 207 may be used to generate a beam towards substrate 205.

In some embodiments, the substrate is displaced while growing the film thereon, for example using deposition stage 206. The substrate may be rotated, tilted and/or displaced linearly along x, y, z axes. In some embodiments, displacing the substrate comprises changing an angle between the substrate and the molecular beam, for example from a position where the substrate is normal to the beam to a position where the substrate is non-normal (or non-perpendicular) to the beam. In some embodiments, the substrate is kept stationary during part or all of the MBE process.

At step 404, a cooling shroud inside the vacuum chamber is cooled to cryogenic temperatures using a cryocooler coupled to the cooling shroud, directly or indirectly. For example, cooling shroud 208 is cooled by cryocooler 210. The cooling shroud comprises at least one surface, and may take various forms, such as having one or more sections which can be nested. Separate cryocoolers may be used to cool separate sections of the cooling shroud, or a single cryocooler having multiple cooling stages may be used, with each stage coupled to a different section of the cooling shroud.

At step 406, impurities inside the vacuum chamber are trapped on the cooling shroud to prevent the impurities from contaminating the growing film. Note that although illustrated as sequentially, steps 402, 404 and 406 can occur concurrently during the MBE process.

In some embodiments, vibrations generated by the cryocooler are damped using one or more damping mechanism. For example, a damping mechanism may be used to attach the cryocooler to an enclosure forming the vacuum chamber. In another example, a thermal coupling mechanism placed between the cryocooler and the cooling shroud may also serve to damp the vibrations.

It will be understood that the embodiments described herein provide an MBE apparatus and method that is free of cryogenic fluids used for the purpose of cooling the cooling shroud. All design elements associated with the flow of the cryogenic fluids over the cooling shroud may be omitted, including flow channels, piping, inlet and outlet ports, and the like. The cooling shroud is instead cooled by virtue of a cryocooler, for example a Gifford-McMahon cryocooler or a pulse tube cryocooler.

The above description is meant to be exemplary only, and one skilled in the art will recognize that changes may be made to the embodiments described without departing from the scope of the invention disclosed. Still other modifications which fall within the scope of the present disclosure will be apparent to those skilled in the art, in light of a review of this disclosure.

Various aspects of the apparatus and method described herein may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments. The scope of the following claims should not be limited by the embodiments set forth in the examples, but should be given the broadest reasonable interpretation consistent with the description as a whole.

The invention claimed is:

1. An apparatus for molecular beam epitaxy comprising:
an enclosure defining a vacuum chamber;
a substrate holder mounted within the vacuum chamber;
at least one molecular beam source in fluid communication with the vacuum chamber;
a cooling shroud mounted within the vacuum chamber and having at least one surface spaced from the substrate holder; and
a cryocooler having at least a portion extending into the vacuum chamber and operatively coupled to the cooling shroud for extracting heat therefrom and cooling the at least one surface to cryogenic temperatures.

2. The apparatus of claim 1, wherein the cryocooler comprises a base outside of the enclosure, a cooling tube mounted to the base and extending into the vacuum chamber and a cold finger mounted to the cooling tube inside the vacuum chamber.

3. The apparatus of claim 1, further comprising a vibration damping mechanism attaching the cryocooler to the enclosure.

4. The apparatus of claim 3, wherein the vibration damping mechanism is outside of the enclosure.

5. The apparatus of claim 1, wherein the cryocooler comprises a plurality of stages, and each one of the stages is operatively coupled to the cooling shroud.

6. The apparatus of claim 1, further comprising a thermal coupling mechanism between the cryocooler and the cooling shroud.

7. The apparatus of claim 1, wherein the cooling shroud comprises a plurality of sections spaced apart.

8. The apparatus of claim 7, wherein the plurality of sections of the cooling shroud are nested.

9. The apparatus of claim 1, wherein the substrate holder is a multi-axis deposition stage.

10. The apparatus of claim 1, wherein the cryocooler is a Gifford-McMahon cryocooler or a pulse tube cryocooler.

11. A method for molecular beam epitaxy, the method comprising:
generating a molecular beam of material towards a substrate provided on a substrate holder inside a vacuum chamber to grow a film on the substrate;
cooling a cooling shroud inside the vacuum chamber to cryogenic temperatures using a cryocooler operatively coupled to the cooling shroud, the cooling shroud having at least one surface spaced from the substrate holder; and
trapping impurities on the at least one surface of the cooling shroud inside the vacuum chamber.

12. The method of claim 11, further comprising displacing the substrate while growing the film on the substrate.

13. The method of claim 12, wherein displacing the substrate holder comprises at least one of rotating and tilting the substrate.

14. The method of claim 12, wherein displacing the substrate comprises changing an angle between the substrate and the molecular beam.

15. The method of claims 11, further comprising damping vibration caused by the cryocooler through a vibration damping mechanism attaching the cryocooler to an enclosure defining the vacuum chamber.

16. The method of claim 11, wherein trapping impurities on the at least one surface of the cooling shroud comprises trapping impurities on a plurality of spaced apart sections of the cooling shroud.

17. The method of claim 16, wherein the plurality of sections are nested.

18. The method of claim 16, wherein cooling the cooling shroud comprises applying the cryocooler to the plurality of sections using multiple stages of the cryocooler.

19. The method of claim 11, wherein cooling the cooling shroud comprises applying an end of the cryocooler to a thermal coupling mechanism in contact with the cooling shroud.

20. The method of claim 11, wherein the cryocooler is a Gifford-McMahon cryocooler or a pulse tube cryocooler.

* * * * *